(12) United States Patent
Chandrasekaran

(10) Patent No.: US 6,970,038 B2
(45) Date of Patent: Nov. 29, 2005

(54) SWITCHING SCHEME TO IMPROVE LINEARITY AND NOISE IN SWITCHED CAPACITOR STAGE WITH SWITCHED FEEDBACK CAPACITOR

(75) Inventor: Ramesh M. Chandrasekaran, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 69 days.

(21) Appl. No.: 10/742,183

(22) Filed: Dec. 19, 2003

(65) Prior Publication Data
US 2005/0134368 A1    Jun. 23, 2005

(51) Int. Cl.$^7$ ................................................ H03F 1/14
(52) U.S. Cl. .......................... 330/9; 330/282; 327/337
(58) Field of Search .................... 330/9, 282; 327/337

(56) References Cited

U.S. PATENT DOCUMENTS

| | | | | |
|---|---|---|---|---|
| 5,703,589 A | * | 12/1997 | Kalthoff et al. | 341/172 |
| 6,147,522 A | * | 11/2000 | Rhode et al. | 327/93 |
| 6,242,974 B1 | * | 6/2001 | Kunst | 330/9 |
| 6,509,792 B2 | * | 1/2003 | Engl | 330/9 |
| 6,731,155 B2 | * | 5/2004 | Hakkarainen et al. | 327/390 |

* cited by examiner

Primary Examiner—Patricia Nguyen
(74) Attorney, Agent, or Firm—W. Daniel Swayze, Jr.; W. James Brady; Frederick J. Telecky, Jr.

(57) ABSTRACT

A switch capacitor amplifier using a "bottom plate sampling" type arrangement in the feedback network to mitigate the reduction in linearity due to feedback switch charge injection. The switch (18A) connecting the feedback capacitor (Cf) to the opamp (15) input is opened prior to the switch (19A) connecting the feedback capacitor (Cf) to the output such that the charge injected into the opamp input nodes come from the switch connected to the opamp input, and is independent of the signal value to the first order as the switches are at the opamp input common mode voltage.

19 Claims, 2 Drawing Sheets

SWITCHING SCHEME TO IMPROVE LINEARITY AND NOISE IN SWITCHED CAPACITOR STAGE WITH SWITCHED FEEDBACK CAPACITOR

FIELD OF THE INVENTION

The present invention relates to electrical circuits and, more particularly, to a switched capacitor circuit and method for switched feedback capacitor.

BACKGROUND OF THE INVENTION

The following documents are incorporated herein by reference: K. Nagaraj, H. S. Fetterman, J. Anidjar, S. H. Lewis, and R. G. Renninger, "A 250 mW 8-b 52 Msamples/s Parallel-Pipelined A/D Converter With Reduced Number of Amplifiers", IEEE Journal of Solid State Circuits, Vol. 32, No. 3, March 1997; and P. Yu and H. S Lee, "A 2.5v, 12-b, 5-Msamples/s Pipelined CMOS ADC", IEEE Journal of Solid Sate Circuits, Vol. 31, No. 12, March 1996.

Switched capacitors are one of the basic building blocks in analog circuitry. A switch, which couples a potential to a capacitor, closes to charge the capacitor to the potential. The switch then opens so that the charge remains on the capacitor. Switched-capacitor amplifiers are widely used in metal oxide semiconductor (MOS) integrated circuits, for example, as amplifiers or comparators in analog-to-digital or digital-to-analog converters. Typically these integrated circuits are used in low-power systems. The input and feedback portions of such switched-capacitor amplifiers are formed using capacitors rather than resistors. Because integrated capacitors are generally smaller than integrated resistors, switched-capacitor amplifiers can be fabricated more compactly than amplifier circuits based on resistors. Further, the gain of switched-capacitor amplifiers is determined by the ratio of the integrated capacitors used in the input and feedback portions of the amplifier circuit. Because the integrated capacitors can be manufactured to high tolerances, switched-capacitor amplifiers can be fabricated with accurate gains.

However, conventional switched-capacitor amplifiers exhibit a number of non-ideal characteristics which must be addressed. One such characteristic is the charge injection effect from the MOS switches. Charge injection is the charge in the channel of the transistor dissipating by leakage to the drain and/or the source of the transistor. In this case, as the switch opens (i.e., the MOS is switched off), there is a transfer of charge from the transistor to the capacitor. As accuracy requirements for circuits become more stringent, the effect of charge injection error becomes correspondingly more problematic.

SUMMARY

The present invention achieves technical advantages as a switched capacitor circuit and system using a switched feedback capacitor and further using an advantageous switching scheme to improve the linearity.

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1A:
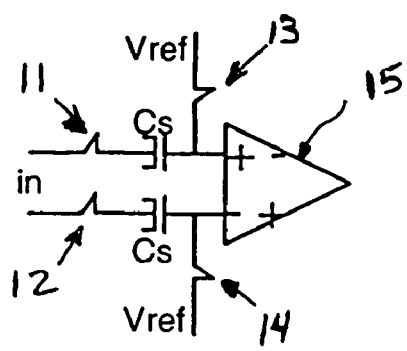
FIGS. 1A and 1B illustrate a conventional switch capacitor amplifier circuit.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 1B:
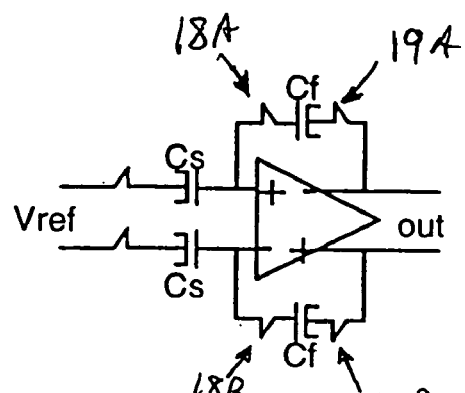

Referring now to FIGS. 1A and 1B there are illustrated a conventional switched capacitor amplifier. More particularly, a sampling capacitors $C_s$ is connected between the input and a reference voltage via switches 11 and 12 during a sampling phase where the reference voltage is also connected to the two opamp inputs via switches 13 and 14. Two objectives are met: 1) the capacitor $C_s$ samples the input (and holds equivalent charge on the node connected to the opamp input at the end of this phase) and, 2) the opamp input terminals are charged to the same potential (i.e., any charge difference in the opamp input capacitors $C_{oa}$ are nullified). Referring now to FIG. 1B, during the feedback phase, a feedback capacitor $C_f$ is connected between the opamp input and the opamp output in which each feedback capacitor $C_f$ is coupled using switches 18A and 19A, and 18B and 19B. The input end of $C_s$ is connected to a reference voltage during this phase. This causes an amplified version of the input voltage to appear at the output.

Figure 2:
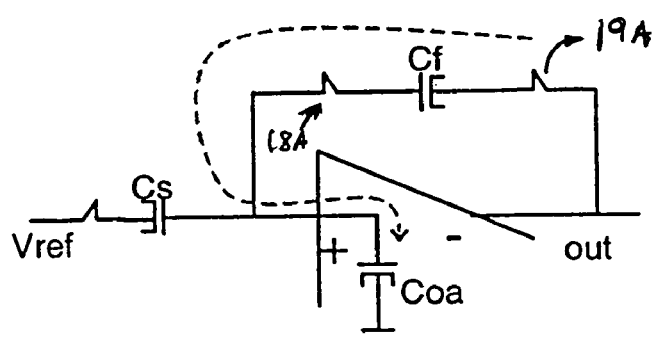
FIG. 2 is a circuit for illustrating the effect of a conventional switching scheme using a conventional switch feedback capacitor.

When the feedback capacitor $C_f$ is disconnected by opening switches 18A and 19A, the switch 19A connected to the output injects a charge on the opamp input capacitor $C_{oa}$ as illustrated in FIG. 2. This charge is dependent on the output voltage and causes signal dependent charge injection into the opamp 15, which is detrimental to linearity of the amplifier. This detrimental signal dependent charge injection via the feedback circuit is alleviated during the sampling phase in conventional operation in which the opamp input nodes are reset as discussed above, canceling this charge. Thus, if the reset period is avoided or is too short for charge cancellation to required precision, loss of linearity or addition of noise occurs.

"Bottom plate sampling" is a standard practice that has made possible the implementation of high precision circuits using switched capacitor topology. "Bottom plate sampling" has conventionally been applied to the input sampling network, where the sampling linearity is considerably improved. In accordance with embodiments of the present invention, the same concept of "Bottom plate sampling" is applied to the feedback network of a switched capacitor feedback amplifier, to similarly improve the linearity of the output switching network and in other cases, improve the noise performance of the amplifier.

Further, referring back to FIG. 1A, switch 11 is connected to the "bottom plate" of capacitor Cs and switch 13 to the "top plate". The bottom plate refers to the capacitor plate closer to the silicon substrate. As a consequence, it has larger parasitic capacitance than the top plate. During sampling, both switches are closed, charging the plates of capacitor Cs to Vin and Vref. At the end of sampling, switched 13 is opened first followed by switch 11. This switching order considerably improves the linearity of the entire stage, and is referred to as "bottom plate sampling".

All switches inject charges when turning on and off. This charge is dependent on the voltage that is being switched on or off. Thus, the charge injected by switch 11 is dependent on the input voltage and by switch 13 on the reference voltage. If switch 11 is opened before 13, it injects a input dependent charge causing nonlinearity in the amplified output. This effect is doubled in differential circuits (as in FIG. 1) as switch 12 is connected to the opposite polarity input voltage (with respect to the common mode) and correspondingly injects charge of opposite polarity. If switch 13 is opened first, it injects a charge that is independent of the input voltage as it switches a fixed voltage Vref. For differential circuits as shown in FIG. 1A, switch 14 injects exactly the same amount of charge with the same polarity as switch 13, which cancel and have no effect on the amplified output voltage. Any mismatch in the switches or switch timing only appears as offset voltage at the output, and not as nonlinearity, which is acceptable in typical applications. Thus, considerable linearity improvement is achieved by this switching scheme and is usually used with switched capacitor sampling circuits.

Figure 3:
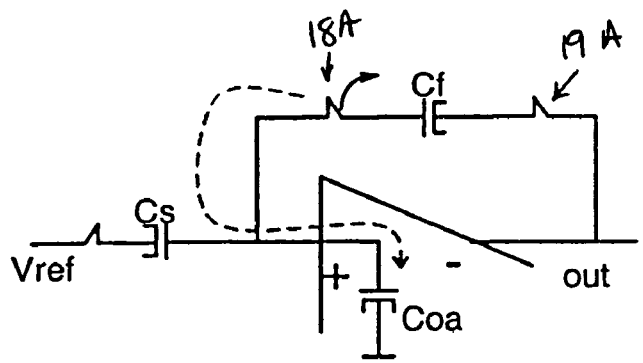
FIG. 3 illustrates a switch capacitor scheme in accordance with exemplary embodiments of the present invention.

Referring to FIG. 3 there is illustrated a switch capacitor scheme and associated switching scheme in accordance with exemplary embodiments of the present invention in which the switch 18A connecting the feedback capacitor $C_f$ to the opamp input is opened prior to the switch 19A connecting the feedback capacitor $C_f$ to the opamp output. With this scheme, the charge injected into the opamp input nodes come from the switches connected to the opamp inputs, and is independent of the output signal value as the switches are at the fixed opamp input common mode voltage. In comparison to opening the output switch first (or at the same instant as the input switch), this results in considerable linearity improvement.

The present switched capacitor circuit and switching scheme are cooperable for operating the opamp without a reset period. A scheme having no reset period enables the opamp to be shared between stages or be operated at twice the speed, resulting is power and/or area improvements. Designs that could benefit from using the present scheme are pipelined analog-to-digital converters and high gain cascaded amplifiers, for example.

Figure 4:
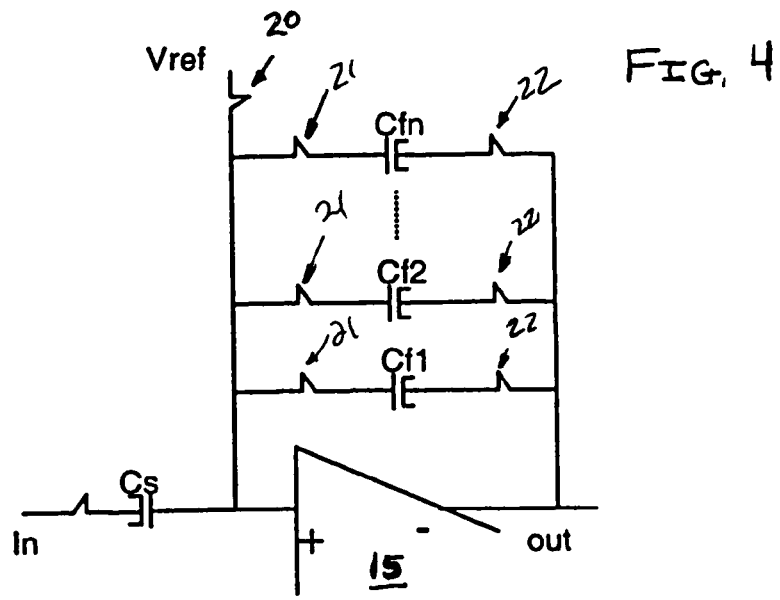
FIG. 4 illustrates a programmable gain amplifier that can change gain at clock rate by switching feedback capacitor which illustrates possible noise improvement in particular implementations of these type of circuits which do have reset periods.

Referring now to FIG. 4, in the case of programmable gain amplifiers that change gain by changing feedback capacitors, reducing the output dependent charge injection into the opamp input terminals can considerably reduce the "memory effect". This effect arises when the charging of the opamp input terminals during a conventional reset phase is slower than required for a complete reset (maybe as a result of a trade off requiring small switch size at opamp input), resulting in an offset dependant on previous output. The effect can be thought of as caused by "low impedance" of the opamp input node during reset phase not being "low" enough. Here the noise performance is improved if the charge injection is minimized, and may be imperative if gain is changed at clock rate.

Note the circuit configuration is dependent on application, however, the purpose of the above paragraph is to convey the concept rather than to precisely spell out the application.

Referring again to FIG. 4, capacitor Cs is connected to Vin and Vref in clock phase $\phi_1$ to sample the input voltage. In phase $\phi_2$, the feedback capacitors are connected between the opamp input and output terminals to produce the amplified output. In conventional schemes, no particular sequence is applied to turn off the feed back switches when disconnecting the feedback capacitor. This causes output dependent charge injection on to the capacitor in the opamp input node. This charge is expected to be reset during the reset or sampling phase, resulting in a trade off involving the size of the switch connected to the reference. The trade off is between the large size of switch connected to the reference and the extent to which the charge needs to be reset. This trade off is exacerbated in particular cases when multitude of input and feedback capacitors exist and the parasitic capacitance is large on the opamp input node. An embodiment of the present invention relaxes the constraints on this tradeoff by reducing the output dependent charge injection to the capacitance on the opamp input node. This is done by opening switch 22 prior to opening switch 21 ensuring that the charge injected is not dependent on the output, but only on the opamp common mode voltage. For differential circuits, this injection cancels, and any mismatch causes an injection that is independent of the signal. Thus, the result is only an offset, considerably improving the noise performance.

Many applications would benefit from an opamp scheme which operates without an input reset period, as during this period, the opamp is not functional, while consuming power. A typical example would be the case of sharing opamp between two cascaded stages. Other applications may involve using the opamp in two corresponding stages in parallel channels and using the opamp to process two different signals in the same channel (i.e., operate at twice the speed). In such applications, the power and area may be reduced or can be traded for speed.

Opamp sharing schemes are based on the premise that the limitation to employing opamp sharing occurs from the non-infinite opamp open-loop gain. It has not been recognized that the predominant limitation is occurring from signal dependent charge injection from the feedback capacitor switch. Non-infinite opamp open-loop gain causes the same effect, but to a much lesser extent, especially in high open loop gain opamps.

Figure 5:
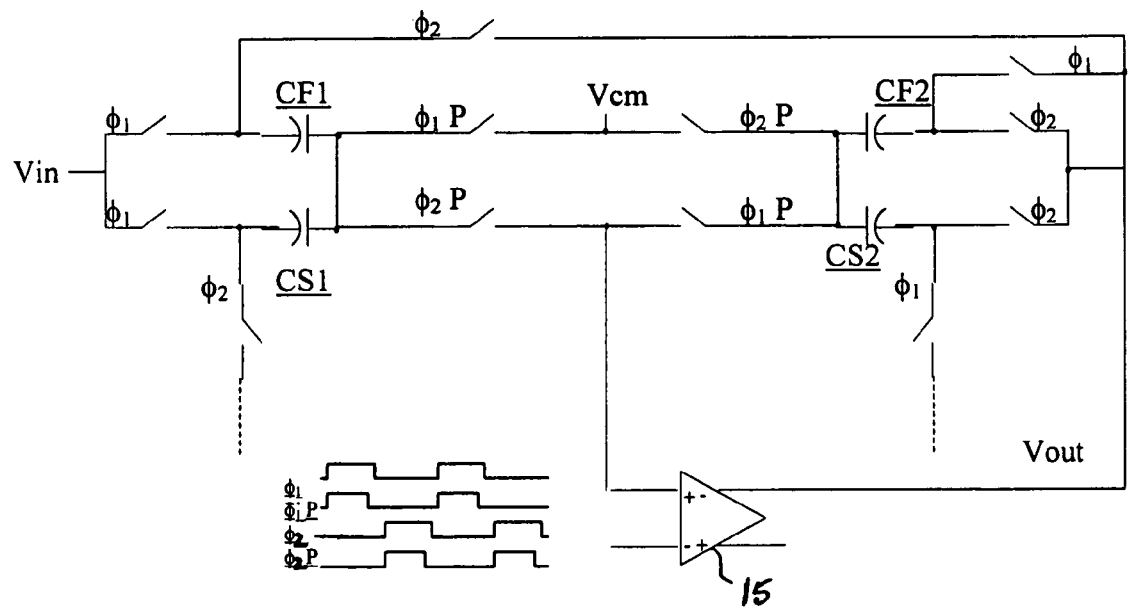
FIG. 5 illustrates an opamp sharing topology in accordance with exemplary embodiments of the present invention.

Referring now to FIG. 5 there is illustrated an opamp sharing topology in accordance with exemplary embodiments of the present invention. This topology shares the opamp 15 between two adjacent gain stages; the signal is first gained in the first stage and then by the second. In phase $\phi_1$ the first stage samples the input on the first stage capacitors CF1 and CS1 by connecting the capacitors to the input and the reference voltage Vcm through switches. At the end of the sampling phase the switches connected to the reference are opened first ($\phi_{1p}$) as per the bottom plate sampling technique discussed earlier. In phase $\phi_2$ stage 1 amplifies the sampled voltage by connecting the bottom plates of CF1 to the opamp output and CS1 to a suitable reference and the top plates to the opamp input. At the same time, the second stage samples the amplified outputs on the capacitors CS2 and CF2. At the end of this phase the top plates of CF1 and CS1 are disconnected from the opamp inputs before disconnecting the bottom plates, as per the embodiment of the present invention. In the following phase $\phi_1$, the second stage amplifies by connecting the bottom plates of CF2 to the opamp output and of CS2 to a suitable reference, while connecting the top plate to the opamp input. At the end of this phase the top plates of CF2 and CS2 are first disconnected from the opamp input ($\phi_{1p}$) before disconnecting the bottom plates, as per the embodiment of the present invention. This helps to considerably improve the linearity as the output of a given stage is no longer influenced by the other stage output.

Here, when the first stage completes feedback, the injection from the first stage feedback switch is prevented, enabling better accuracy of the second stage. This would be needed in the case of two cascaded gain stages, where both stages need to maintain the same linearity. The second stage feedback capacitor is connected to the output in both phases and hence the switches have been omitted in K. Nagaraj et al. However, an always-on dummy switch could improve settling, by canceling frequency dependent feedback if the time constants on the sampling and feedback capacitors are chosen to be equal. These switches are shown here to illustrate the proposed switching scheme for both stages. Use of the proposed switching scheme results in different tradeoffs. In P. Yu and H. S. Lee, the second stage of the opamp is shared between adjacent stages of the opamp and introduces a switch between the first and second opamp stage, degrading the settling behavior. The proposed scheme, on the other hand, introduces a switch at the opamp input and can be used with single stage opamps as well.

Although exemplary embodiments of the invention are described above in detail, this does not limit the scope of the invention, which can be practiced in a variety of embodiments.

What is claimed is:

1. A switched-capacitor system, comprising:
   an amplifier having an input and an output; and
   first and second switched-capacitor circuits, said first switched-capacitor circuit being coupled between said input and said output, said second switched-capacitor circuit being coupled between said input and an input voltage, said first switched-capacitor circuit and said second switched-capacitor circuit are cooperable for providing a common mode voltage at said input to produce a zero level output; and
   said first switched-capacitor circuit further for attenuating injection error charge into said input.

2. The switched-capacitor system of claim 1, wherein said amplifier is operable without having a separate phase period for resetting injection error charge.

3. The switched-capacitor system of claim 1, wherein said injection error charge is produced by switching of said first switched-capacitor circuit.

4. The switched-capacitor system of claim 3, wherein said first switched-capacitor circuit includes a bottom plate sampling arrangement between said amplifier output and input.

5. The switched-capacitor system of claim 4, wherein said first switched-capacitor circuit includes a capacitor having a top plate coupled to said amplifier input via a first switch and a bottom plate coupled to said amplifier output via a second switch.

6. The switched-capacitor system of claim 5, wherein sampling of said capacitor includes first opening said first switch prior to opening said second switch.

7. The switched-capacitor system of claim 6, wherein said first and second switches are transistor.

8. The switched-capacitor system of claim 3, wherein said first switched-capacitor circuit includes a plurality of capacitors in a parallel arrangement for bottom plate sampling between said amplifier output and input.

9. The switched-capacitor system of claim 8, wherein each of said capacitors includes a top plate coupled to said amplifier input via respective first switches and a bottom plate coupled to said amplifier output via respective second switches.

10. The switched-capacitor system of claim 9, wherein one of said capacitors is selectable for sampling by closing respective first and second switches for charging and subsequently opening said respective first switch prior to said respective second switch.

11. A feedback circuit in a switch-capacitor system in which a switch-capacitor input circuit is coupled between the input of an amplifier and an input voltage; comprising:
    a capacitor having a bottom plate coupled to an output of the amplifier and having a top plate coupled to the input of the amplifier; and
    a switching feedback circuit selectively coupling said capacitor to the amplifier input and output, wherein said switching feedback circuit and capacitor are cooperable with said switch-capacitor input circuit for providing a common mode voltage at the amplifier input to produce a zero level output; and
    said switching feedback circuit further for attenuating injection error charge into said input.

12. The feedback circuit of claim 11, wherein the amplifier is operable without having a separate phase period for resetting injection error charge.

13. The feedback circuit of claim 11, wherein said injection error charge is produced by switching of said switching feedback circuit.

14. The feedback circuit of claim 11, wherein said capacitor top plate is coupled to the amplifier input via a first switch of said switching feedback circuit and said bottom plate is coupled to the amplifier output via a second switch of said switching feedback circuit.

15. The feedback circuit of claim 14, wherein sampling of said capacitor includes first opening said first switch prior to opening said second switch.

16. The feedback circuit of claim 15, wherein said first and second switches are transistor.

17. The feedback circuit of claim 11 further comprising a further capacitor coupled in parallel with said capacitor such that a bottom plate is coupled to the output of the amplifier and a top plate is coupled to the input of the amplifier.

18. The feedback circuit of claim 17, wherein said further capacitor top plate is coupled to the amplifier input via a further first switch and said further capacitor bottom plate is coupled to the amplifier output via a further second switch.

19. The feedback circuit of claim 18, wherein one of said capacitors is selectable for sampling by closing respective first and second switches for charging and subsequently opening said respective first switch prior to said respective second switch.

* * * * *